(12) United States Patent
Buechin

(10) Patent No.: US 10,409,326 B2
(45) Date of Patent: Sep. 10, 2019

(54) SYSTEMS AND METHODS FOR DEVICE CASE MAGNETS

(71) Applicant: RAKUTEN KOBO, INC., Toronto (CA)

(72) Inventor: Anna Buechin, Toronto (CA)

(73) Assignee: RAKUTEN KOBO, INC., Toronto (CA)

(*) Notice: Subject to any disclaimer, the term of this patent is extended or adjusted under 35 U.S.C. 154(b) by 195 days.

(21) Appl. No.: 15/678,971

(22) Filed: Aug. 16, 2017

(65) Prior Publication Data

US 2018/0049529 A1 Feb. 22, 2018

Related U.S. Application Data

(60) Provisional application No. 62/375,745, filed on Aug. 16, 2016.

(51) Int. Cl.
*A45F 5/00* (2006.01)
*F21V 3/00* (2015.01)
(Continued)

(52) U.S. Cl.
CPC ............ *G06F 1/1626* (2013.01); *A45C 11/00* (2013.01); *A45C 13/1069* (2013.01); *A45F 5/00* (2013.01);
(Continued)

(58) Field of Classification Search
CPC combination set(s) only.
See application file for complete search history.

(56) References Cited

U.S. PATENT DOCUMENTS 8,724,300 B2 * 5/2014 Smith ................... G06F 1/1628
206/320
8,780,535 B2 * 7/2014 Mongan ................. A45C 11/00
361/679.01

(Continued)

FOREIGN PATENT DOCUMENTS

CN 102054369 A 5/2011
JP 3204680 U 6/2016

OTHER PUBLICATIONS

International Search Report and Written Opinion dated Jan. 23, 2018 in PCT/IB2017/001175.
(Continued)

*Primary Examiner* — Lisa Lea-Edmonds
(74) *Attorney, Agent, or Firm* — Xsensus, LLP

(57) ABSTRACT

A protective case for an electronic reading device includes a back cover, wherein the back cover is configured to secure the electronic reading device. The back cover includes a plurality of metal plates, each of the plurality of metal plates disposed in a predetermined location. The protective case also includes a front cover, wherein the front cover includes a plurality of magnets, each of the plurality of magnets being disposed in a predetermined location and one or more of the plurality of magnets being positioned based on the location of one or more corresponding metal plates. The front cover also includes a Hall sensor magnet positioned on top of a magnet shielding, wherein the Hall sensor magnet is positioned between the magnet shielding and the back cover of the protective case when the protective case is in a closed position.

20 Claims, 4 Drawing Sheets

(51) Int. Cl.

| | | |
|---|---|---|
| *G06F 1/16* | (2006.01) | |
| *G06F 1/20* | (2006.01) | |
| *G09G 3/34* | (2006.01) | |
| *G09G 5/02* | (2006.01) | |
| *G09G 5/10* | (2006.01) | |
| *H01Q 1/22* | (2006.01) | |
| *H04M 1/02* | (2006.01) | |
| *H04M 1/04* | (2006.01) | |
| *H04M 1/18* | (2006.01) | |
| *H05K 5/00* | (2006.01) | |
| *H05K 7/14* | (2006.01) | |
| *H05K 7/18* | (2006.01) | |
| *A45C 11/00* | (2006.01) | |
| *A45C 13/10* | (2006.01) | |
| *F21V 23/00* | (2015.01) | |
| *F21V 33/00* | (2006.01) | |
| *G06F 3/041* | (2006.01) | |
| *H01H 13/83* | (2006.01) | |
| *G02F 1/1333* | (2006.01) | |
| *G06F 1/3296* | (2019.01) | |
| *H05B 33/08* | (2006.01) | |
| *H05B 37/02* | (2006.01) | |
| *F21Y 115/10* | (2016.01) | |
| *F21W 111/10* | (2006.01) | |
| *G06F 3/0484* | (2013.01) | |
| *G06F 3/0488* | (2013.01) | |

(52) U.S. Cl.
CPC .............. *F21V 3/00* (2013.01); *F21V 23/003* (2013.01); *F21V 33/0056* (2013.01); *G02F 1/133308* (2013.01); *G06F 1/1632* (2013.01); *G06F 1/1698* (2013.01); *G06F 1/203* (2013.01); *G06F 1/3296* (2013.01); *G09G 3/3413* (2013.01); *G09G 5/02* (2013.01); *G09G 5/10* (2013.01); *H01H 13/83* (2013.01); *H01Q 1/22* (2013.01); *H04M 1/0279* (2013.01); *H04M 1/04* (2013.01); *H04M 1/185* (2013.01); *H05B 33/0857* (2013.01); *H05B 33/0863* (2013.01); *H05B 33/0872* (2013.01); *H05B 37/0218* (2013.01); *H05B 37/0281* (2013.01); *H05K 5/0017* (2013.01); *H05K 7/1417* (2013.01); *H05K 7/18* (2013.01); *A45C 2011/002* (2013.01); *A45C 2011/003* (2013.01); *A45C 2200/15* (2013.01); *A45F 2200/0516* (2013.01); *F21W 2111/10* (2013.01); *F21Y 2115/10* (2016.08); *G06F 3/041* (2013.01); *G06F 3/0488* (2013.01); *G06F 3/04847* (2013.01); *G06F 2200/1633* (2013.01); *G06F 2200/1634* (2013.01); *G09G 2320/0626* (2013.01); *G09G 2320/0666* (2013.01); *G09G 2320/08* (2013.01); *G09G 2354/00* (2013.01); *G09G 2360/141* (2013.01); *G09G 2360/144* (2013.01); *G09G 2360/16* (2013.01); *G09G 2380/14* (2013.01); *H04M 1/0214* (2013.01); *H04M 1/0245* (2013.01)

(56) References Cited

U.S. PATENT DOCUMENTS

| | | | |
|---|---|---|---|
| 8,878,637 B2* | 11/2014 | Sartee | G06F 1/16 335/219 |
| 8,884,730 B2* | 11/2014 | Lauder | H01F 7/04 206/320 |
| 8,928,437 B2* | 1/2015 | Lauder | G06F 1/1626 206/320 |
| 8,975,991 B2* | 3/2015 | Lauder | H01F 7/04 335/219 |
| 10,206,490 B2* | 2/2019 | Kang | A45C 11/00 |
| 2013/0176503 A1* | 7/2013 | Ariga | H04N 5/64 348/731 |
| 2013/0279096 A1 | 10/2013 | Gengler | |
| 2014/0205799 A1 | 7/2014 | Lin et al. | |
| 2015/0153768 A1 | 6/2015 | Shih et al. | |
| 2015/0222736 A1 | 8/2015 | Oh | |
| 2016/0246334 A1 | 8/2016 | Lin et al. | |
| 2016/0266614 A1 | 9/2016 | Lin et al. | |
| 2017/0300085 A1* | 10/2017 | Hintermann | G06F 1/1626 |

OTHER PUBLICATIONS

"How do smart covers work?." *eBay*, Jun. 29, 2014. Web. <http://www.ebay.com/gds/How-Do-Smart-Covers-Work-/10000000178627029/g.html>.

"Besdata ultra thin magnetic smart cover [auto wake/sleep function] & translucent back case for apple 2013 ipad air (5th gen 9.7" full size ipad) + screen protector + cleaning cloth + stylus (black)." *Amazon*, Oct. 30, 2013. Web. <https://www.amazon.com/Magnetic-Smart-Cover-Translucent-Protector/dp/B00GARWQVI>.

* cited by examiner

SYSTEMS AND METHODS FOR DEVICE CASE MAGNETS

CROSS-REFERENCE TO RELATED APPLICATION

This application claims the benefit of U.S. Provisional Application No. 62/375,745, filed Aug. 16, 2016, herein incorporated by reference in its entirety. Related applications, U.S. Pat. No. 9,451,818, U.S. Pat. No. 475,276, U.S. Pat. No. 475,274, U.S. Pat. No. 475,275, U.S. Pat. No. 475,280, U.S. Pat. No. 475,282, and U.S. Pat. No. 475,277 are herein incorporated by reference in their entirety.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Mobile computing devices, such as laptops, PDAs, media players, game consoles, touchpads, smartphones, e-readers etc., have evolved to become more and more sophisticated. With the rapidly developing technologies on Internet data storage, data transmission, and wireless communication as well as on data-handling capabilities of mobile computing devices, consumers increasingly spend extended time using such devices, such as watching videos, viewing photos, video conferencing, reading books, Internet browsing, sending emails, on-line chatting, playing video games, etc. To suit consumers' demand for portability, the design trend of various mobile computing devices continues to emphasize making the devices smaller and thinner. Most modern portable computing devices are installed with a touchscreen panel that is fixed to the device body. To view the display screen hands-free in an ergonomic view angle to reduce related visual discomforts, a user usually needs to position the device in an inclined angle (or an upright position) on a horizontal resting surface, e.g., a desk. Most mobile computing device products are not equipped with a built-in stand for supporting the device in an upright position. External accessories of various configurations are typically used to prop such a device in a user-intended orientation. In some of the accessory products, a stand is integrated with a protective case customized for a device model; while others are designed exclusively as a stand.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to aspects of the disclosed subject matter, a protective case for an electronic reading device includes a back cover, wherein the back cover is configured to secure the electronic reading device. The back cover includes a plurality of metal plates, each of the plurality of metal plates disposed in a predetermined location. The protective case also includes a front cover, wherein the front cover includes a plurality of magnets, each of the plurality of magnets being disposed in a predetermined location and one or more of the plurality of magnets being positioned based on the location of one or more corresponding metal plates. The front cover also includes a Hall sensor magnet positioned on top of a magnet shielding, wherein the Hall sensor magnet is positioned between the magnet shielding and the back cover of the protective case when the protective case is in a closed position.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
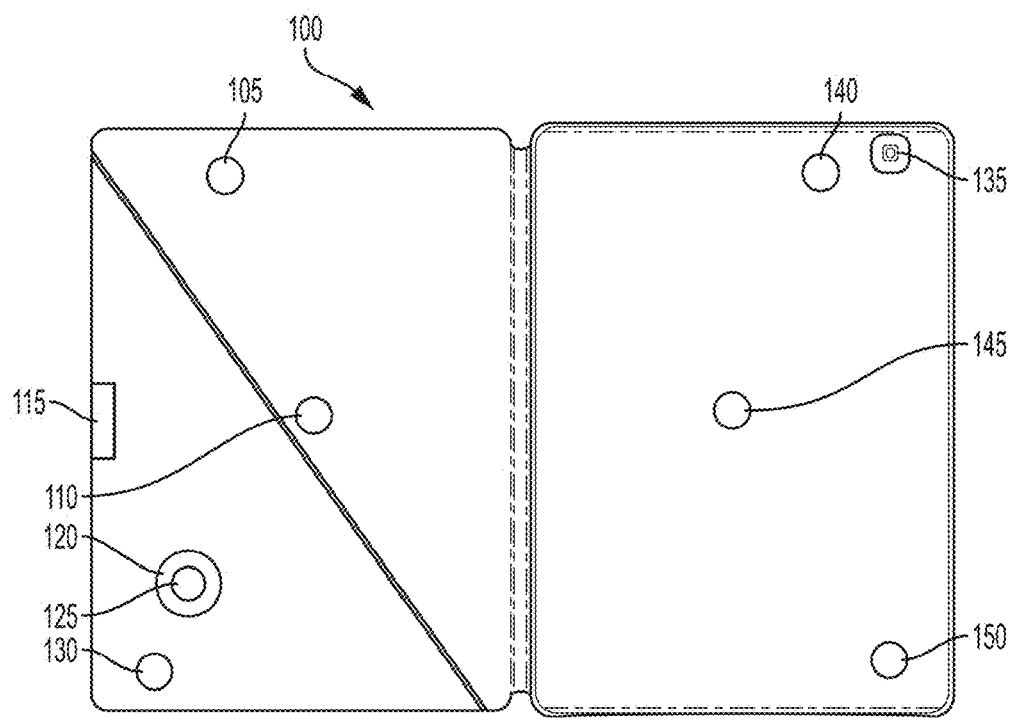
FIG. 1 depicts an exemplary overview of a protective case according to one or more aspects of the disclosed subject matter.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

FIG. 1 depicts an exemplary overview of a protective case 100 according to one or more aspects of the disclosed subject matter. The protective case 100 can be configured to employ a one-fold stand structure on a foldable hard cover designed as an accessory for a mobile computing device (e.g., electronic reading device). The foldable hard cover may serve as a front cover, for example, to protect the display screen of the computing device in a covered position and as a stand in open display position. The foldable cover can include an upper portion, a flap portion, and a single folding hinge between the two portions and extending diagonally across the foldable cover. The flap portion can be rotated about the single holding hinge between a coplanar position with the upper portion and a folded position. Being folded twice, the foldable cover can be converted into a display stand operable to retain the device in an inclined angle on a supporting surface, thus providing a comfortable view angle to a device user. The flap portion may be the lower portion of the front cover or an extra layer coupled to the front cover at the single folding hinge. Further, the foldable front cover may be coupled to a back cover through a hinge spine. The back cover may be non-foldable or alternatively have the same folding configuration and thus can fold in unison with the front cover into a stand.

Overall, provided herein is a mobile computing device protective case with at least one foldable cover having an angled folding hinge around which a flap member of the foldable cover can rotate to a folded position. Thereby, the foldable cover is converted to a stand operable to support the mobile computing device at an inclined angle with reference to a supporting surface.

In an embodiment, an exemplary protective case can have a diagonal folding hinge on the front cover and operable to protect an electronic reading device as well as support it in an upright position in accordance with an embodiment of the present disclosure.

The protective case can include a front cover and a back cover that are rotatably coupled together through a hinge spine. The electronic reading device can be detachably affixed (snapped in) and secured to the back cover, for example. The front cover can have a single folding hinge that divides the front cover into an upper portion next to the hinge spine and a lower portion.

The folding hinge of the cover can run approximately diagonally across the front cover and terminates near two opposite edges of the rectangular front cover. The lower portion can have an edge that coincides with a long edge of the front cover, and another edge that coincides with a substantial portion of a short edge of the front cover.

When the electronic reading device is not in use, the two portions of the front cover can be coplanar and can advantageously cover the entire display screen (the front side) of the electronic reading device to protect it from external damage. Also, the back cover can be used to protect the back side of the electronic reading device.

When the electronic reading device is in use, and particularly with the display screen on, the front cover can be rotated around the hinge spine to an open display position to uncover the display screen. If a user intends to retain the electronic reading device in an upright position hands-free, the front cover can be rotated further towards the back side of the electronic reading device (e.g., folded behind the electronic reading device), and the lower portion can be rotated relative to the upper portion around the folding hinge to a folded position. That is, subject to a single fold, the front cover is converted into a sturdy supporting stand. The lower portion at the folded position has only the edge directly contacting the supporting surface. As a result, the electronic reading device can advantageously rest on the external supporting surface in an inclined angle.

The front cover with the lower portion in a single folded position can uprightly support the electronic reading device in both portrait and landscape orientations. The lower portion and the upper portion form an angle of 130° at the instant folded position, for example. Without changing the folded position of the lower portion relative to the upper portion, the front cover can support the tablet in an upright position in both a portrait view mode and a landscape view mode. That is, a user can change a view orientation of the electronic reading device without readjusting the folding angle of the front cover. However in some other embodiments, a portrait view mode and a landscape view mode may require the front cover be folded in different angles to achieve stability.

The protective case and the associated components may be manufactured by any suitable processes and materials that are well known in the art. The back cover may primarily have a rigid and non-foldable panel. In an embodiment, one or more magnets may be installed (e.g., embedded) in the front cover and/or the back cover such that the upper portion can be conformal to the back cover by force of the magnets.

At the folded position, the upper portion and the lower portion can form an angle of 130°, for example, which can also be the stop position for the lower portion. A continuous range of stable view angles may be achieved as a user adjusts the lower portion between the position coplanar with the upper portion and the stop position. It will be appreciated that the stop position, or the rotation limit of the lower portion, is dependent on the configuration of the foldable cover. During the product design for a protective case according to the present disclosure, a stop position can be determined by factoring in the weight and dimension of the mobile computing device, the geometry, location and orientation of the folding hinge, the materials used to manufacture the front cover and the back cover, the range of inclined angles to be achieved, and etc.

The protective case may be made of soft materials (for exterior and interior surfaces) covering one or more rigid panels or reinforcement structures. The soft materials may include one or more of polyurethane (PU) laminate, neoprene, silicone, microfiber cloth, leather, rubber, vinyl, polyvinyl chloride (PVC), plastic, etc. The reinforcement structure may include one or more of stiff polycarbonate (PC) or other plastic, wood, metal, etc.

The folding hinge area may include only the soft materials and lack a reinforcement structure. In an embodiment, the upper portion and the lower portion of a front cover may have different materials in their respective reinforcement structures, for instance an EVA foam sheet for the lower portion and polycarbonate for the upper portion.

It will be appreciated that the configuration of a convertible protective case can be customized for a single or multiple mobile device models. A protective case can be designed for any type of mobile electronic device, such as tablet computer, touchpad, smartphone, e-reader, laptop, GPS, PDA, and etc.

The protective case 100 can include a first stand magnet 105, a second stand magnet 110, a closing magnet 115, a magnet shielding 120, a Hall sensor magnet 125, a flap magnet 130, a button cover 135 (e.g., the button cover 135 can be integrated into the back cover of the protective case 100 and be configured to cover a power/sleep button integrated into the electronic reading device), a first metal plate 140, a second metal plate 145, and a flap metal plate 150. More specifically, a front cover of the protective case 100 (wherein the front cover corresponds to a left side of the protective case 100 as depicted in FIG. 1) can include the first stand magnet 105, the second stand magnet 110, the closing magnet 115, the magnet shielding 120, the Hall sensor magnet 125, and the flap magnet 130. Additionally, a back cover the protective case 100 (wherein the back cover corresponds to a right side of the protective case as depicted in FIG. 1) can include the button cover 135, the first metal plate 140, the second metal plate 145, and the flap metal plate 150. Each of the first stand magnet 105, the second stand magnet 110, the closing magnet 115, the magnet shielding 120, the Hall sensor magnet 125, the flap magnet 130, the button cover 135, the first metal plate 140, the second metal plate 145, and the flap metal plate 150 can be positioned in a predetermined location on the protective case 100 such that each component can interact with either another component of the protective case 100 and/or a corresponding component of an electronic reading device when the protective case 100 is secured to the electronic reading device.

Figure 2:
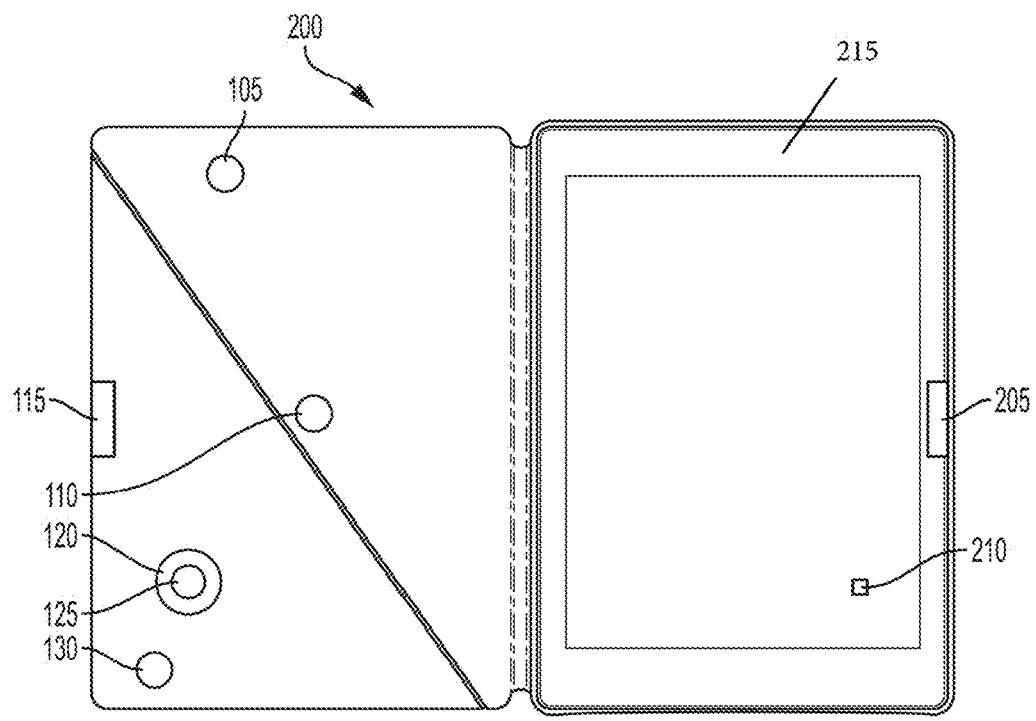
FIG. 2 depicts an exemplary overview of an electronic reading device with a protective case according to one or more aspects of the disclosed subject matter.

FIG. 2 depicts an exemplary overview of a system 200 including an electronic reading device 215 with a protective case (e.g., protective case 100) according to one or more aspects of the disclosed subject matter. The protective case of the system 200 can include the first stand magnet 105, the second stand magnet 110, the closing magnet 115, the magnet shielding 120, the Hall sensor magnet 125, and the flap magnet 130, the button cover 135, the first metal plate 140, the second metal plate 145, and the flap metal plate 150 while an electronic reading device is secured within the back cover of the protective case 100. The electronic reading device 215 can include a device closing magnet 205 and a Hall sensor 210. The device closing magnet 205 can be positioned in a predetermined location within the electronic reading device 215 such that the device closing magnet 205 can be configured to magnetically connect with the closing magnet 115 when the front cover of the protective case 100 is in a closed position (e.g., the front cover of the protective case is covering the electronic reading device 215), for example. Similarly, the Hall sensor 210 can be positioned in a predetermined location within the electronic reading device 215 such that the Hall sensor magnet 125 interacts with the Hall sensor 210 when the protective case 100 is in the closed position.

Figure 3A:
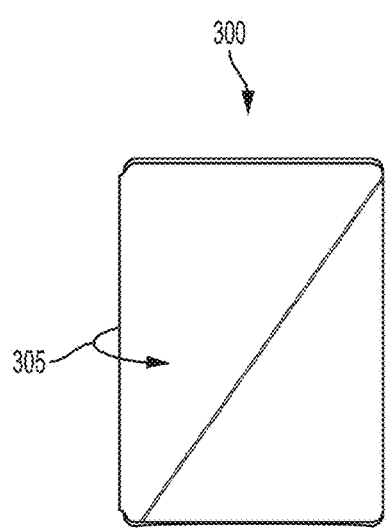
FIG. 3A depicts a front view of a protective case in a closed position according to one or more aspects of the disclosed subject matter.

FIG. 3A depicts a front view of a system 300 including a protective case (e.g., protective case 100) in a closed position according to one or more aspects of the disclosed subject matter. Arrow 305 can correspond to a closing direction of the protective case of the system 300 such that the closing direction corresponds to a front cover of the protective case covering a front of the electronic reading device (e.g., electronic reading device 215) while the electronic reading device 215 is secured in a back cover of the protective case.

Figure 3B:
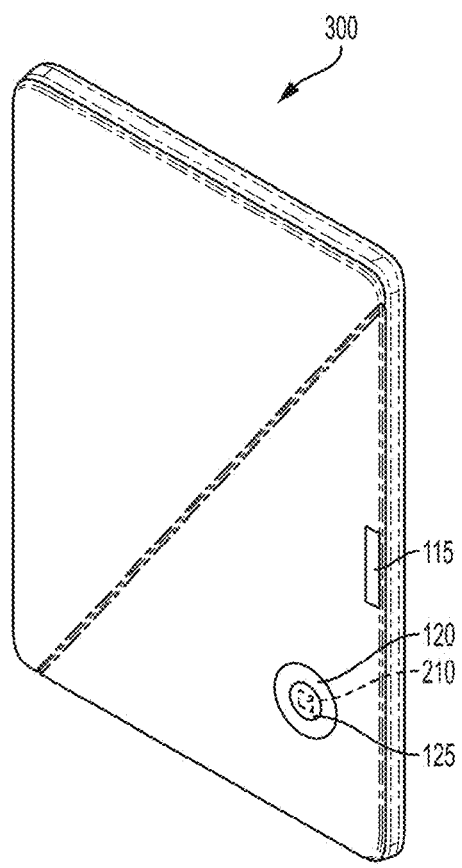
FIG. 3B depicts a perspective view of a protective case in a closed position according to one or more aspects of the disclosed subject matter.

FIG. 3B depicts a perspective view of the system 300 including the protective case (e.g., the protective case 100) in a closed position according to one or more aspects of the disclosed subject matter. More specifically, the front cover of the protective case can cover the front of the electronic reading device 215 and be secured to the electronic reading device via a magnetic coupling of the closing magnet 115 and the device closing magnet 205 (as shown in FIG. 2). Similarly, the Hall sensor 125 can be positioned in a predetermined location such that the Hall sensor 125 interacts with the Hall sensor 210 (as shown in FIG. 2) when the protective case covers the front of the electronic reading device (e.g., wherein the front of the electronic reading device can correspond to a display of the electronic reading device). The predetermined positioning of the Hall sensor 210 and the Hall sensor magnet 125 allows the electronic reading device to enter a sleep mode. More specifically, the interaction between the Hall sensor 210 and the Hall sensor magnet 125 can be configured to cause the Hall sensor magnet 125 to trigger the Hall sensor 210 which can cause the electronic reading device to enter a sleep mode.

Figure 4A:
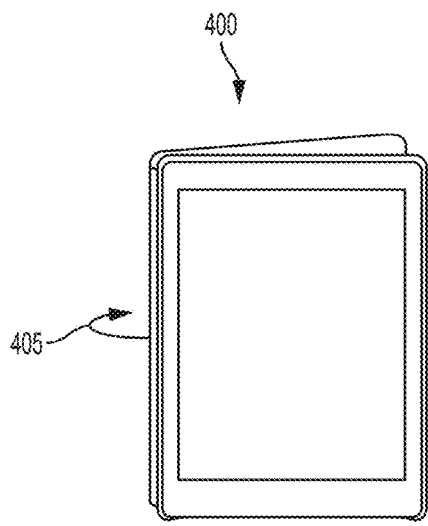
FIG. 4A depicts a front view of a protective case with a portion of the protective case folded behind an electronic reading device according to one or more aspects of the disclosed subject matter.

FIG. 4A depicts a front view of a system 400 including a protective case (e.g., the protective case 100) with a front cover of the protective case folded behind an electronic reading device (e.g., the electronic reading device 215) according to one or more aspects of the disclosed subject matter. Arrow 405 can correspond to a direction indicating the front cover of the protective case being folded behind the electronic reading device.

Figure 4B:
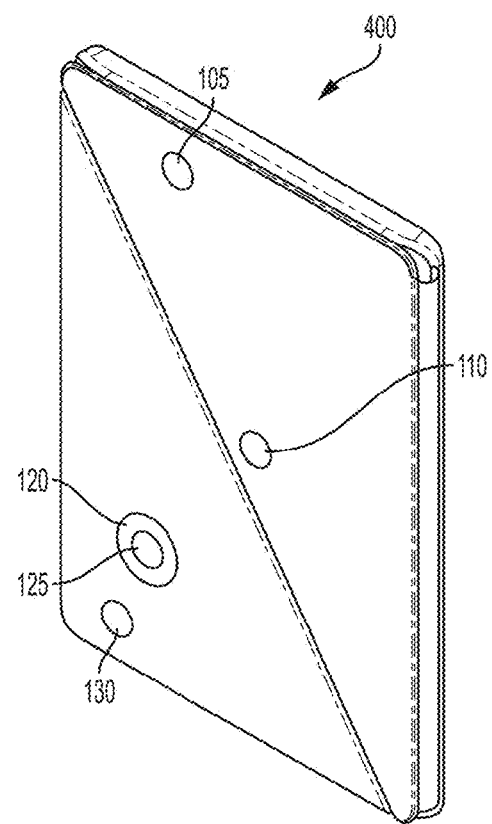
FIG. 4B depicts a perspective view of back of an electronic reading device with a portion of a protective case folded behind the electronic reading device according to one or more aspects of the disclosed subject matter.

FIG. 4B depicts a perspective view of a back of the system 400 wherein the front cover of the protective case (e.g., the protective case 100) is folded behind the electronic reading device (e.g., the electronic reading device 215) according to one or more aspects of the disclosed subject matter. The first stand magnet 105, the second stand magnet 110, and the flap magnet 130 can each be positioned in a predetermined location within the front cover of the protective case such that the predetermined location the first stand magnet 105, the second stand magnet 110, and the flap magnet 130 corresponds to a predetermined position of each of the first metal plate 140, the second metal plate 145, and the flap metal plate 150. More specifically, each of the first stand magnet 105, the second stand magnet 110, and the flap magnet 130 and each of the first metal plate 140, the second metal plate 145, and the flap metal plate 150 can be positioned such that the first stand magnet 105, the second stand magnet 110, and the flap magnet 130 are magnetically coupled to the first metal plate 140, the second metal plate 145, and the flap metal plate 150, respectively, when the front cover of the protective case is folded behind the electronic reading device as show in FIG. 4B. Additionally, the magnet shielding 120 can be positioned in the front cover of the protective case and between the Hall sensor magnet 125 and the electronic reading device. The magnet shielding 120 can be positioned between the Hall sensor magnet 125 and the electronic reading device to prevent the Hall sensor 125 from interacting with the Hall sensor 210 and causing the electronic reading device to enter a sleep mode at an unintended time. In other words, the magnet shielding 120 can prevent the Hall sensor magnet 125 from triggering the Hall sensor 210 when the front cover of the protective case is folded behind the electronic reading device.

Figure 5A:
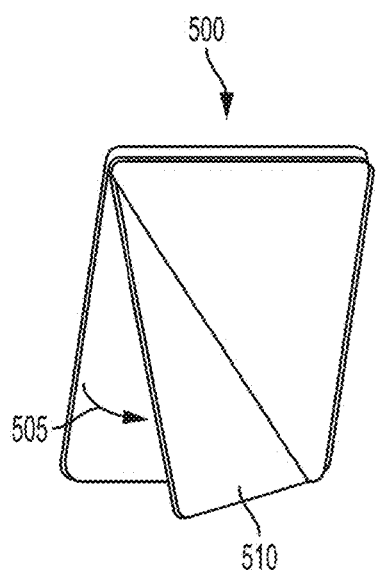
FIG. 5A depicts a perspective view of a protective case in a stand position according to one or more aspects of the disclosed subject matter.

FIG. 5A depicts a perspective view of a system 500 including a protective case (e.g., the protective case 100) in a stand position according to one or more aspects of the disclosed subject matter. In an embodiment, the front cover of the protective case may be folded behind an electronic reading device (e.g., the electronic reading device 215) while the electronic reading device is secured in a back cover of the protective case. While the front cover of the protective case is folded behind the electronic reading device, a portion of the front cover (e.g., portion 510) may be folded out as depicted by arrow 505 such that the portion 510 can be used as a stand, for example.

Figure 5B:
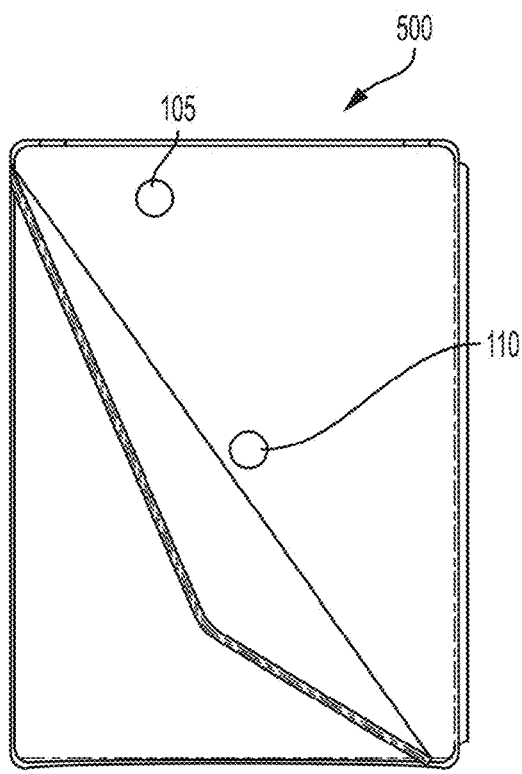
FIG. 5B depicts a rear view of a protective case in a stand position according to one or more aspects of the disclosed subject matter.

FIG. 5B depicts a rear view of the system 500 wherein the portion 510 of the front cover of the protective case can be in a stand position according to one or more aspects of the disclosed subject matter. While the portion 510 is in the stand position, the first stand magnet 105 and the second stand magnet 110 can remain magnetically coupled to the first metal plate 140 and the second metal plate 145 disposed in the back cover of the protective case, thereby keeping the front cover of the protective case secured to the back cover of the protective case while the portion 510 is free to move into and/or return from the stand potion.

The protective case 100 has several advantages including precise position of the various magnets, metal plates, and shielding. For example, the functionality of the protective case can be significantly enhanced as a result of the position of the various components (wherein the components can include the first stand magnet 105, the second stand magnet 110, the closing magnet 115, the magnet shielding 120, the Hall sensor magnet 125, the flap magnet 130, the button cover 135, the first metal plate 140, the second metal plate 145, and the flap metal plate 150) because the protective case can be secured in a closed position (e.g., when the front cover of the protective case 100 covers a display of the electronic reading device 215) and/or a reading position (e.g., when the front cover of the protective case 100 is folded behind the electronic reading device 215). Additionally, even in the reading position, the portion 510 of the front cover of the protective case 100 can be folded into a stand position. Further, the magnet shielding 120 allows for the protective case 100 to be in the reading position while preventing any interaction between the Hall sensor magnet 125 and the Hall sensor 210 so the electronic reading device is not inadvertently put into a sleep mode.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly. Applicant(s) intend(s) to embrace all such alternatives, modifications, equivalents, and variations that are within the spirit and scope of the disclosed subject matter.

The invention claimed is:

1. A protective case, comprising:
  a back cover, wherein the back cover is configured to secure an electronic reading device, the back cover including
    a plurality of metal plates, each of the plurality of metal plates disposed in a predetermined location; and
  a front cover, the front cover including
    a plurality of magnets, each of the plurality of magnets being disposed in a predetermined location and one or more of the plurality of magnets being positioned based on the location of one or more corresponding metal plates, and
    a Hall sensor magnet positioned on top of a magnet shielding. wherein the Hall sensor magnet is positioned between the magnet shielding and the back cover of the protective case when the protective case is in a closed position.

2. The protective case of claim 1, wherein the plurality of metal plates includes a first metal plate, a second metal plate, and a flap metal plate.

3. The protective case of claim 2, wherein the plurality of magnets includes a first stand magnet, the first stand magnet being positioned based on the first metal plate.

4. The protective case of claim 2, wherein the plurality of magnets includes a second stand magnet, the second stand magnet being positioned based on the second metal plate.

5. The protective case of claim 2, wherein the plurality of magnets includes a flap magnet, the flap magnet being positioned based on the flap metal plate.

6. The protective case of claim 2, wherein the first metal plate, the second metal plate, and the flap metal plate are magnetically coupled to the first stand magnet, the second stand magnet, and the flap magnet, respectively, to secure the front cover of the protective case to the back cover of the protective case when the front cover of the protective case is folded behind the electronic reading device.

7. The protective case of claim 2, wherein the first metal plate and the second metal plate are magnetically coupled to the first stand magnet and the second stand magnet, respectively, and a portion of the front cover of the protective case is folded into a stand position.

8. The protective case of claim 6, wherein the magnetic shielding is configured to prevent the Hall sensor magnet from triggering a Hall sensor disposed in the electronic reading device when the front cover of the protective case is folded behind the electronic reading device.

9. The protective case of claim 1, wherein the plurality of magnets includes a first closing magnet in a first predetermined location within the front cover, the first predetermined location of the closing magnet being based on a second closing magnet disposed in the electronic reading device, the predetermined location of the first closing magnet being configured to magnetically couple to the second closing magnet when the front cover is in a closed position, wherein the closed position corresponds to the front cover covering a display of the electronic reading device.

10. The protective case of claim 9, wherein the Hall sensor magnet is positioned in a predetermined location of the front cover based on the Hall sensor located in a predetermined position of the electronic reading device, the Hall sensor magnet being configured to trigger the Hall sensor when the front cover of the protective case is secured to the electronic reading device via the first closing magnet and the second closing magnet, wherein the electronic reading device enters a sleep mode in response to the Hall sensor magnet triggering the Hall sensor.

11. A system, comprising:
an electronic reading device including
a Hall sensor; and
a protective case, the protective case including
a back cover, wherein the back cover is configured to secure an electronic reading device, and
a front cover, the front cover including
a plurality of magnets, each of the plurality of magnets being disposed in a predetermined location, and
a Hall sensor magnet positioned on top of a magnet shielding, wherein the Hall sensor magnet is positioned between the magnet shielding and the back cover of the protective case when the protective case is in a closed position.

12. The system of claim 11, wherein the back cover includes a plurality of metal plates, at least one of the metal plates being disposed in a predetermined location within the protective case, the predetermined location of the at least one metal plate being based on the location of a corresponding magnet from the plurality of magnets.

13. The system of claim 12, wherein the plurality of metal plates includes a first metal plate disponed within the back cover, the first metal plate being positioned based on a first stand magnet disposed within the front cover.

14. The system of claim 12, wherein the plurality of metal plates includes a second metal plate disposed within the back cover, the second metal plate being positioned based on the second stand magnet disposed within the front cover.

15. The system of claim 12, wherein the plurality of metal plates includes a flap metal plate disposed within the back cover, the flap metal plate being positioned based on the flap magnet disposed within the front cover.

16. The system of claim 12, wherein the first metal plate, the second metal plate, and the flap metal plate are magnetically coupled to the first stand magnet, the second stand magnet, and the flap magnet, respectively, to secure the front cover of the protective case to the back cover of the protective case when the front cover of the protective case is folded behind the electronic reading device.

17. The system of claim 12, wherein the first metal plate and the second metal plate are magnetically coupled to the first stand magnet and the second stand magnet, respectively, and a portion of the front cover of the protective case is folded into a stand position.

18. The system of claim 16, wherein the magnetic shielding is configured to prevent the Hall sensor magnet from triggering a Hall sensor disposed in the electronic reading device when the front cover of the protective case is folded behind the electronic reading device.

19. The system of claim 11, wherein the plurality of magnets includes a first closing magnet in a first predetermined location within the front cover, the first predetermined location of the closing magnet being based on a second closing magnet disposed in the electronic reading device, the predetermined location of the first closing magnet being configured to magnetically couple to the second closing magnet when the front cover is in a closed position, wherein the closed position corresponds to the front cover covering a display of the electronic reading device.

20. The system of claim 19, wherein the Hall sensor magnet is positioned in a predetermined location of the front cover based on the Hall sensor located in a predetermined position of the electronic reading device, the Hall sensor magnet being configured to trigger the Hall sensor when the front cover of the protective case is secured to the electronic reading device via the first closing magnet and the second closing magnet, wherein the electronic reading device enters a sleep mode in response to the Hall sensor magnet triggering the Hall sensor.

* * * * *